(12) United States Patent
Buie et al.

(10) Patent No.: US 6,649,075 B1
(45) Date of Patent: *Nov. 18, 2003

(54) METHOD AND APPARATUS FOR MEASURING ETCH UNIFORMITY OF A SEMICONDUCTOR WAFER

(75) Inventors: Melisa J. Buie, Sunnyvale, CA (US); Leonid Poslavsky, Belmont, CA (US); Jennifer Lewis, Littleton, CO (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/686,229

(22) Filed: Jul. 23, 1996

(51) Int. Cl.[7] .............................................. G01L 11/02
(52) U.S. Cl. ............................ 216/59; 216/60; 216/61; 438/706; 438/710; 438/711; 438/712
(58) Field of Search .............................. 216/59, 60, 61; 438/706, 710, 711, 712

(56) References Cited

U.S. PATENT DOCUMENTS

| | | | |
|---|---|---|---|
| 4,394,237 A | | 7/1983 | Donnelly et al. ............ 204/192 |
| 4,493,745 A | | 1/1985 | Chen et al. ................. 156/626 |
| 4,602,981 A | | 7/1986 | Chen et al. ................. 156/627 |
| 4,859,277 A | | 8/1989 | Barna et al. ............... 156/626 |
| 4,954,212 A | * | 9/1990 | Gabriel ...................... 156/627 |
| 4,995,939 A | | 2/1991 | Ferenczi et al. ........... 156/627 |
| 5,014,217 A | * | 5/1991 | Savage ....................... 364/498 |
| 5,160,402 A | * | 11/1992 | Cheng ........................ 156/627 |
| 5,200,023 A | | 4/1993 | Gifford et al. .............. 156/626 |
| 5,288,367 A | | 2/1994 | Angell et al. ............... 156/626 |
| 5,294,289 A | | 3/1994 | Heinz et al. ................ 156/626 |
| 5,308,414 A | | 5/1994 | O'Neill et al. .............. 156/626 |
| 5,338,390 A | | 8/1994 | Barbee et al. ............. 156/627 |
| 5,347,460 A | * | 9/1994 | Gifford ....................... 364/468 |
| 5,348,889 A | * | 9/1994 | Terashima et al. ............. 436/8 |
| 5,362,356 A | * | 11/1994 | Schoenborn ................ 156/626 |
| 5,372,673 A | | 12/1994 | Stager et al. ............... 156/626 |
| 5,392,124 A | | 2/1995 | Barbee et al. ............. 356/381 |
| 5,399,229 A | | 3/1995 | Stefani et al. ............. 156/626 |
| 5,403,433 A | | 4/1995 | Morrison et al. .......... 156/626 |
| 5,445,705 A | | 8/1995 | Barbee et al. ........... 156/627.1 |
| 5,450,205 A | | 9/1995 | Sawin et al. ............... 356/382 |
| 5,451,289 A | | 9/1995 | Barbee et al. ............... 216/59 |
| 5,456,788 A | | 10/1995 | Barbee et al. ............. 156/345 |
| 5,467,883 A | | 11/1995 | Frye et al. ................... 216/60 |
| 5,472,561 A | | 12/1995 | Williams et al. ......... 156/627.1 |
| 5,474,648 A | | 12/1995 | Patrick et al. ........... 156/627.1 |
| 5,573,624 A | * | 11/1996 | Barbee ....................... 156/345 |
| 5,653,894 A | * | 8/1997 | Ibbotson ...................... 216/59 |
| 5,658,423 A | * | 8/1997 | Angell .......................... 438/9 |
| 5,664,066 A | * | 9/1997 | Sun ............................. 395/23 |

OTHER PUBLICATIONS

Sherwood et al. "Calculus" UCLA pp. 20–21, 1954.*
Wahbi et al. "Ratios of first derivative maxima and compensated derivative absorption curve" Analyst, v. 111, pp. 777–780, 1986.*

(List continued on next page.)

*Primary Examiner*—Ceila Chang
(74) *Attorney, Agent, or Firm*—Moser Patterson & Sheridan, LLP.

(57) ABSTRACT

A method and apparatus for performing in situ measurement of etch uniformity within a semiconductor wafer processing system. Specifically, the apparatus and concomitant method analyzes optical emission spectroscopy (OES) data produced by an OES system. The analysis computes the first derivative of the OES data as the data is acquired. When the data meets a particular trigger criterion, the value of the first derivative is correlated with a particular uniformity value. As such, the system produces a uniformity value for a semiconductor wafer using an in situ measurement technique.

6 Claims, 5 Drawing Sheets

OTHER PUBLICATIONS

Shiga et al. "On line differential converter. . . . " CA 76:52832, with original article attached, 1971.*

Sherwood et al. "Calculus" UCLA Pubs. pp. 20–21, 1954.*

Shiga et al. "Online differential converter for obtaining the first derivative of absorption spectra" CA 76:52832, 1972.*

Wahbi et al. "Ratios of first derivative maxima and compensted derivative absorption curves" Analyst vo. 111, pp. 777–780, 1986.*

Webster Dictionary, p. 365, 1976.*

Splichal et al., "Application of Chemometrics to Optical Emission Spectroscopy for Plasma Monitoring", SPIE, vol. 1594, Process Module Metrology, Control, and Clustering, pp. 189–203 (1991).

* cited by examiner

METHOD AND APPARATUS FOR MEASURING ETCH UNIFORMITY OF A SEMICONDUCTOR WAFER

BACKGROUND OF THE DISCLOSURE

1. Field of the Invention

The invention relates to semiconductor wafer processing systems that perform "dry" etching of semiconductor wafers. More particularly, the invention relates to a method and apparatus for performing in situ measurement of etch uniformity as a semiconductor wafer is etched by a semiconductor processing system.

2. Description of the Background Art

Semiconductor processing systems that perform "dry" etch of semiconductor wafers typically rely upon post processing analysis to determine the uniformity of the etch process. To use such post processing techniques, a plurality of wafers are etched and then the amount of material removed by the etch process is measured using depth-measuring equipment, such as a laser interferometer for transparent films or profilometer for opaque films. The measuring equipment measures the etch results at various points on the wafer surface. The relative depth of each point provides an indication of etch uniformity. Such wafer post processing is expensive and consumes many wafers before the uniformity produced by the etch process is satisfactory.

There has been some success in the art in developing in situ etch uniformity measuring systems that utilize optical emission spectroscopy to monitor light emissions from the plasma as the etch process progresses. One such system is disclosed in U.S. Pat. No. 5,362,356 issued Nov. 8, 1994 and incorporated herein by reference. This patent discloses a passive method of monitoring film removal (or deposition) during plasma etching (or deposition) based on interference phenomena. The system monitors plasma emission intensity at a selected wavelength, without additional illuminating apparatus, and variations in plasma emission intensity are correlated to remaining film thickness, etch rate, etch uniformity and etch selectivity. However, to derive a uniformity for a wafer being etched, the '356 invention must make certain assumptions concerning the etch rate and the thickness of the wafer films in order to predict the uniformity at any point during the etch process. Such assumptions can be error prone.

Therefore, a need exists in the art for a method and apparatus for performing direct, in situ measurement of etch uniformity.

SUMMARY OF THE INVENTION

The disadvantages associated with the prior art are overcome by the present invention of a method and apparatus for performing direct, in situ measurement of etch uniformity. Specifically, the present invention analyzes optical emission spectroscopy (OES) data produced by an etch rate monitoring system. The invention computes the first derivative of the OES data as the data is acquired. When the OES data meets a predefined trigger criterion (i.e., a trigger point) such as attaining the etch endpoint or reaching an inflection point in the data, the invention correlates the value of the first derivative with a particular uniformity value. The correlation can be accomplished using a look-up table or a correlation equation. The look-up table or correlation equation are predefined using empirical data. The invention then displays the uniformity value and/or responds in some manner to the uniformity value. The present invention has been found to accurately predict etch uniformity using this direct, in situ measurement technique. As such, extensive post-processing is not necessary which substantially reduces the costs associated with performing an etch process.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention is a method and apparatus for performing a direct, in situ measurement of etch uniformity of a semiconductor wafer within a semiconductor wafer processing system. The invention analyzes optical emission spectroscopy (OES) data collected as a semiconductor wafer is being etched within an etching system, such as Model PE5000 manufactured by Applied Materials, Inc. of Santa Clara, Calif. The OES data may be collected by any type of in situ measuring equipment that provides accurate OES data. Such a system is the OES endpoint system manufactured by Applied Materials, Inc. as an integrated emissions endpoint module for the Model PE5000. Although an OES system is illustratively used for data acquisition, the invention can be used with any system that produces data that indicates etch process progression, e.g., interferometric systems. To simplify the disclosure of the invention, the following discussion presents the invention as adapted to operate within an OES system. From this disclosure, those skilled could adapt the invention to operate within other forms of etch process monitoring system.

Figure 1:
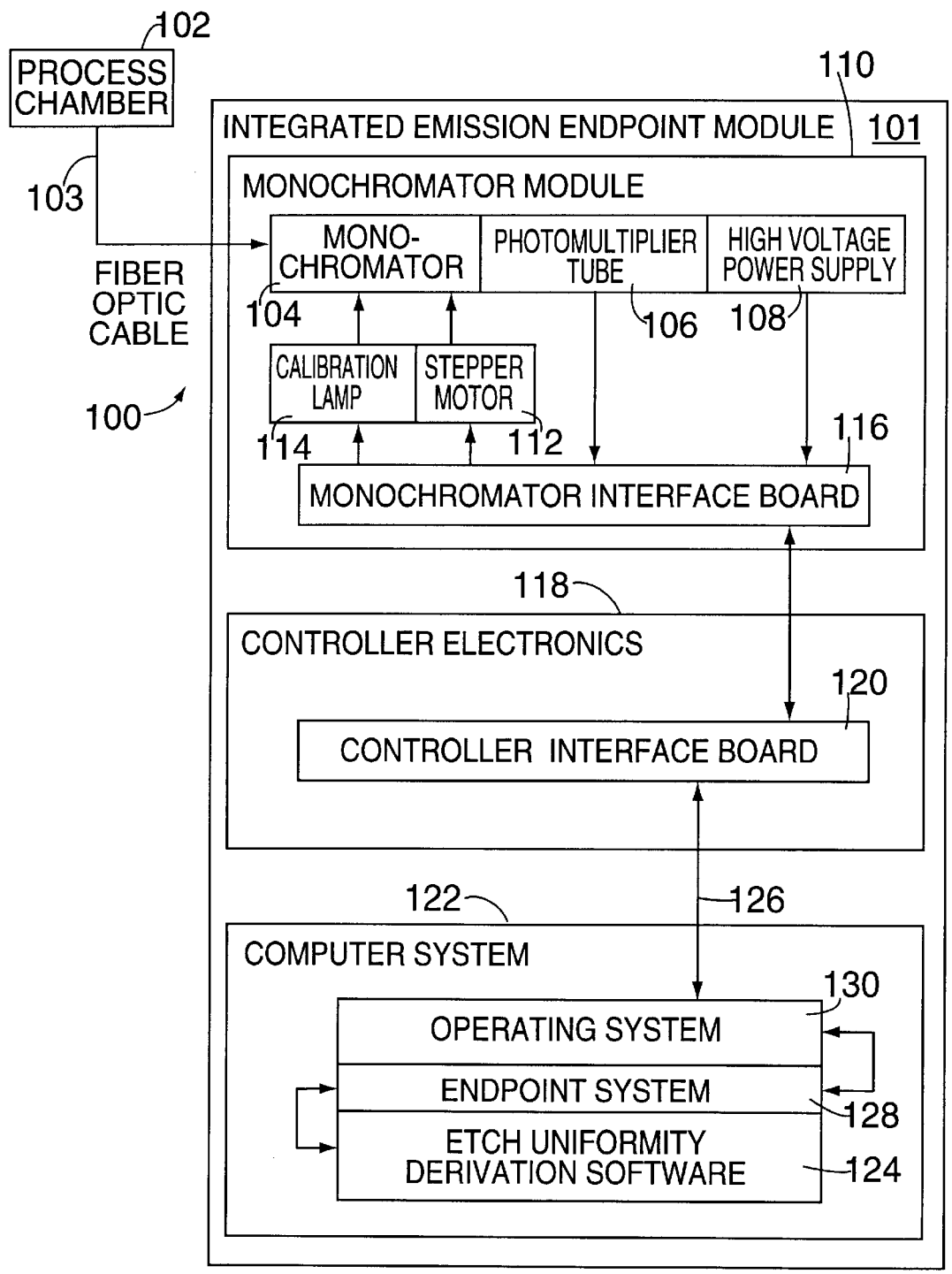
FIG. 1 depicts a block diagram of an optical emission spectroscopy system incorporating the present invention.

FIG. 1 depicts a block diagram of an OES system 100, also known as an optical emission endpoint detection system. The hardware of this system is conventionally used for endpoint detection, whereby data is collected from a monochromator module 110 as it monitors a particular wavelength of emitted light from a plasma in a process chamber 102. A particular change in the intensity of an emission at the monitored wavelength is indicative of the endpoint for the etch process. A typical endpoint detection system is disclosed in U.S. Pat. 5,362,356, issued Nov. 8, 1994. Further processing and analysis of a particular wavelength emission (e.g., the carbon-monoxide (CO) emission line at 4835 angstroms) as the magnitude of the emission changes during the etch process produces information that is indicative of the uniformity of the etch process. The invention is implemented in software within a computer system that processes and analyzes the OES data to deduce the etch uniformity across the wafer surface.

Specifically, FIG. 1 depicts a process chamber 102 of, for example, a PE5000 etching system 100 connected by a fiber optic cable 103 to the integrated emissions endpoint module 101. The integrated emissions endpoint module contains a monochromator module 110, controller electronics 118 and a computer system 122. The monochromator module further contains a monochromator 104, a stepper motor 112 for controlling the wavelength selection for the monochromator, a calibration lamp 114 for calibrating the monochromator, a photomultiplier tube 106, a high-voltage power supply 108, and a monochromator interface board 116. In operation, light generated by a plasma within the process chamber 102 is coupled to the monochromator through the fiber optic cable 103. The monochromator converts the photons carried by the fiber optic cable 103 into electrons. The electrons are multiplied by the photomultiplier tube 106 that is powered by the high-voltage power supply 108. The output of the photomultiplier tube 106 is coupled to the monochromator interface board 116.

In addition, the monochromator interface board 116 controls the stepper motor 112 that selects a particular light wavelength for processing. In particular, the stepper motor controls the position of an interference grid (not shown) within the monochromator to select a particular wavelength of light for analysis. The calibration lamp 114 is coupled to the monochromator to calibrate the monochromator at a particular wavelength.

A DB-25 electrical cable connects the monochromator interface board 116 to the controller interface board 120 within controller electronics 118

The control electronics are coupled to the computer system 122 via a computer bus 126, e.g., a serial bus. The conventional endpoint software 128, as well as the etch uniformity derivation software 124 of the present invention and the computer operating system 130, are stored within and executed by the computer system 122.

The hardware for implementing the foregoing integrated emission endpoint module 101 is available from Applied Materials, Inc. of Santa Clara, Calif. For example, the fiber optic cable is available from Applied Materials, Inc. as part number 0190-09134, the monochromator as part number 0010-09935, the controller electronics as part number 0240-10475, and the computer system as part number 0240-32585.

Figure 2:
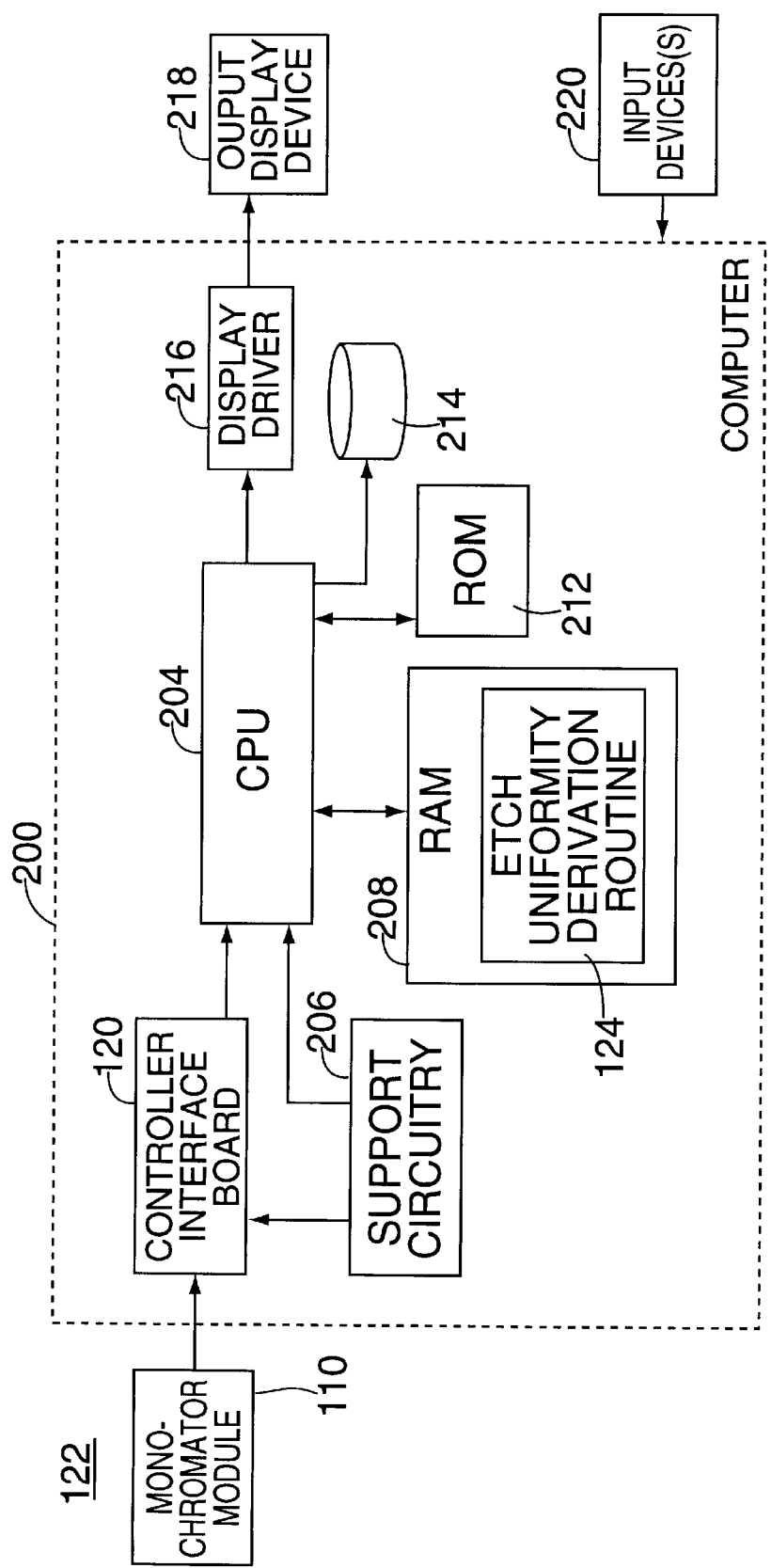
FIG. 2 depicts a block diagram of a computer system that executes a software implementation of the present invention.

FIG. 2 depicts a detailed block diagram of the computer system 122 which facilitates OES data analysis, processing and display. Specifically, the computer 200 contains a central processing unit (CPU) 204, support circuitry 206, random access memory (RAM) 208, read only memory (ROM) 212, mass storage device 214 (e.g., a disk drive), and a display driver 216. Additionally, a user interacts with the computer system through one or more input devices 220, such as a keyboard, mouse, trackball, touch pad, and the like. Also, the computer system displays the data, various graphical interface displays, and the uniformity value(s) on an output display device 218, such as a computer monitor. Alternatively, the computer system may also interact with other output display devices, such as a printer, to provide hard copy of any display that appears on the computer monitor.

The controller interface board 120 preprocesses the data from the monochromator module 110 and provides data transport between the monochromator module and the CPU 204

The CPU 204 is a general purpose processor such as a PowerPC, Pentium, or some other generally available processor. PowerPC is a registered trademark of International Business Machines of Armonk, N.Y. and Pentium is a registered trademark of Intel Corporation, of Santa Clara, Calif. Since the software implementation of the present invention is not required to execute on any specific processor, routines implementing the present invention can be executed upon any type of processor or combination of processors in a parallel processing computer environment. The present embodiment of the invention described herein executes on a Pentium processor that is manufactured by Intel Corporation, of Santa Clara, Calif.

The CPU 204 operates in conjunction with various other circuits such as RAM 208, ROM 212, storage device 214 and support circuitry 206 such as co-processors, clock circuits, cache, power supplies and other well known circuits. The operation and interrelationship of the various computer components contained in general purpose computer are well known in the art and do not require further explanation. The display driver 216 may be a video card, printer driver, or other common driver software and hardware as required by the output device 218.

The RAM 208 stores the software implementation of the present invention, i.e., the etch uniformity derivation routine 124. Typically, the routines of the invention are stored in the mass storage device 214 and recalled for temporary storage in RAM while being executed by the CPU 204.

Figure 3:
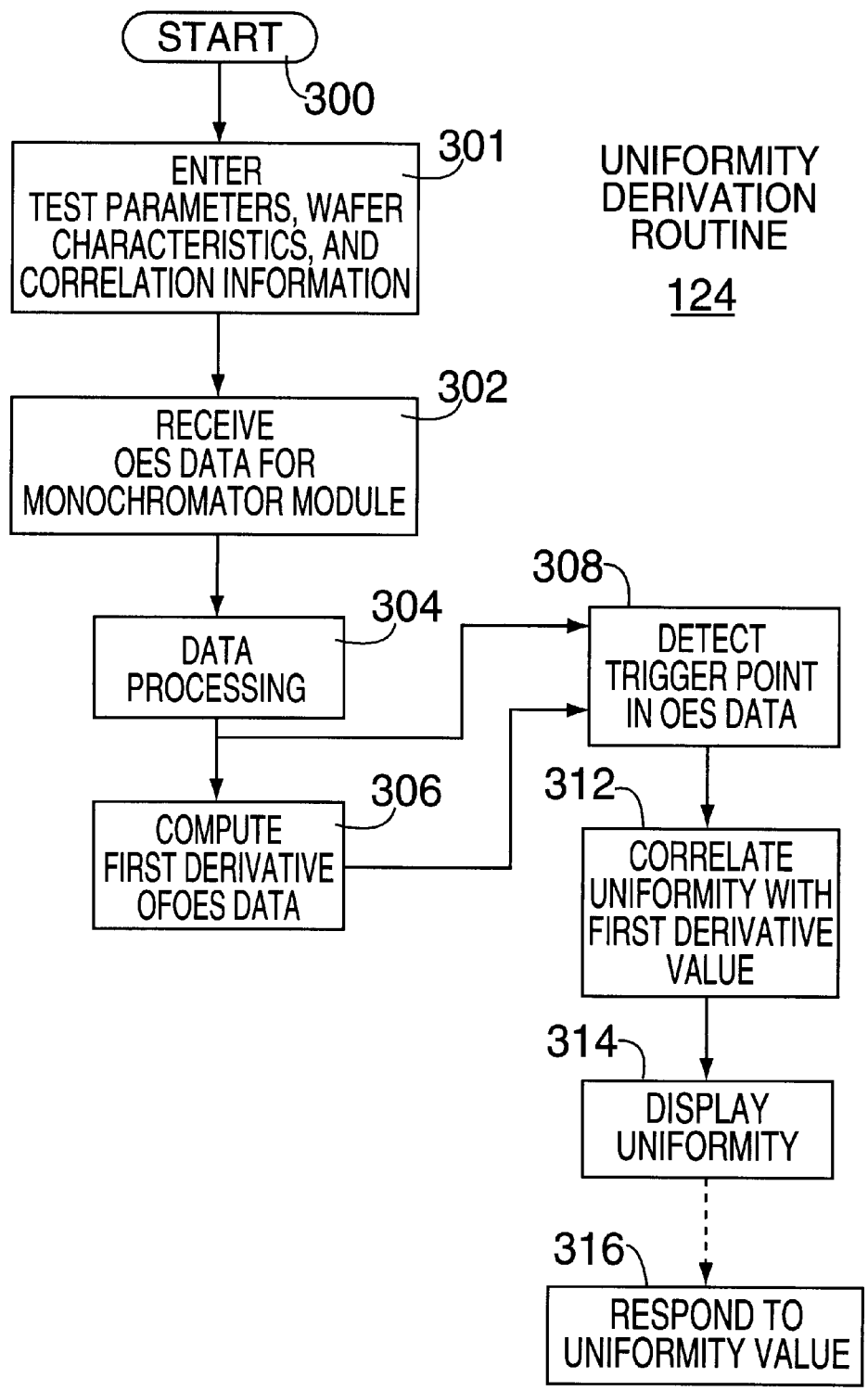
FIG. 3 depicts a flow diagram of an etch uniformity derivation routine that is executed by the computer system of FIG. 2.
Figure 4:
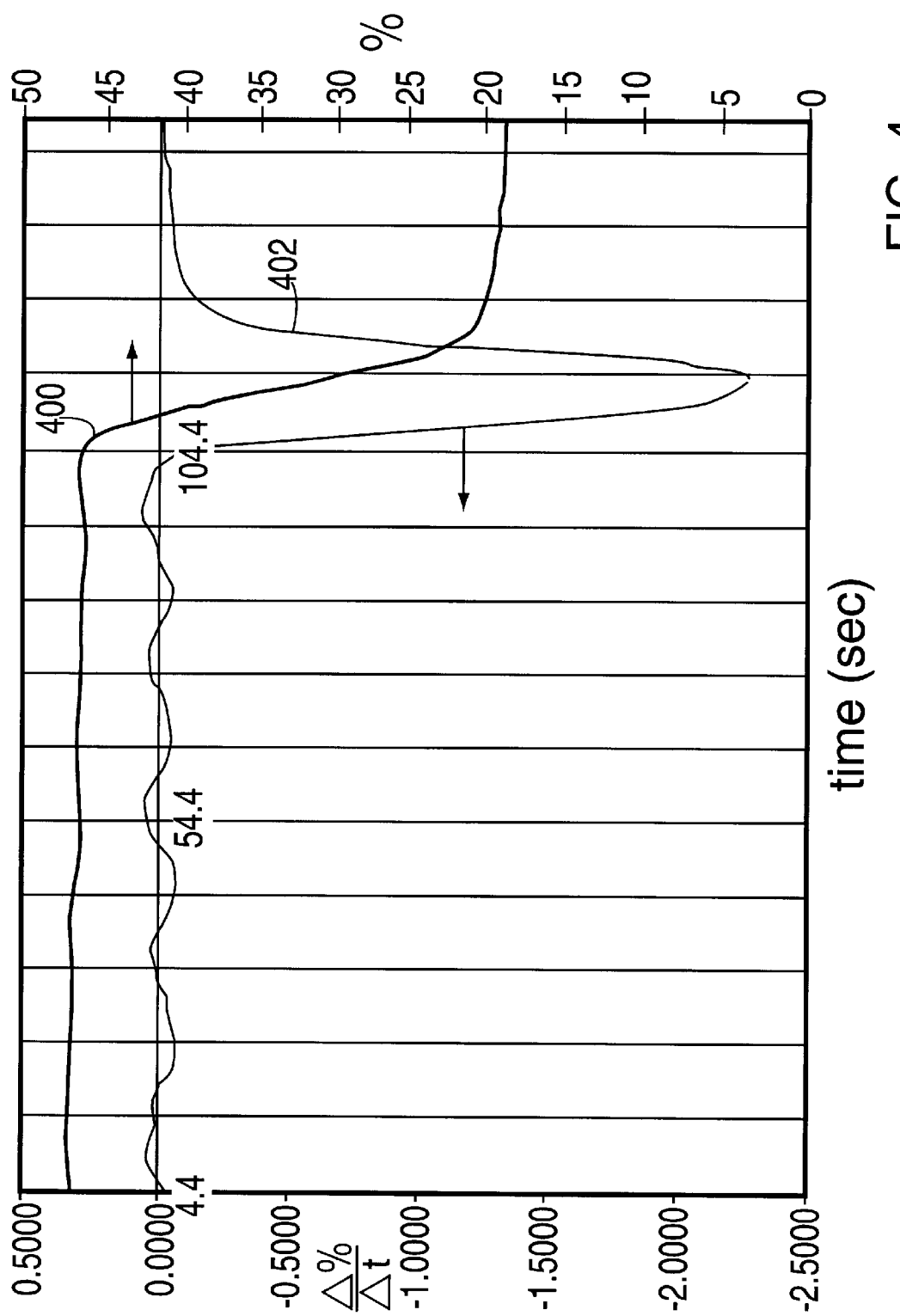
FIG. 4 depicts an illustrative curve of OES data and its first derivative.

FIG. 3 depicts a flow diagram of the etch uniformity derivation routine 124 of the present invention. The routine begins at step 300 and proceeds to step 301. At step 301, a user initializes test parameters, wafer characteristics, and various correlation parameters. Such initialization can be accomplished by entering the information via the computer system input device(s) or by recalling the information from memory. At step 302, the routine receives OES data from the monochromator module. At step 304, the routine processes the OES data. This processing averages the data points to produce a smooth data set that, when plotted, would generate a smooth curve representing the magnitude of the OES data versus time. A rolling average is used to include additional data points into the average as the data is available from the monochromator module. Further processing may include data thresholding, spike filtering and the like. The combination of the system initialization and data acquisition steps form a data acquisition module of the invention. An illustrative OES data curve produced by this module is depicted in FIG. 4 as curve 400. This curve represents the magnitude of the OES data normalized as a percentage of the full scale of the data acquisition equipment (the right-hand scale) versus time, in seconds.

At step 306, the routine 124 computes a first derivative of the data. This step of the routine forms a derivative generator that generates the first derivative by taking a pair of sequential and filtered data points and dividing by the time elapsed between those two filtered data points. The routine repeats this computation as each filtered data point is generated by the monochromator module. Symbolically, the first derivative is:

$$\frac{X_2 - X_1}{\Delta T}$$

where $X_1$ is a first filtered data point, and $X_2$ is a second filtered data point and $\Delta T$ is the time duration between the $X_1$ and $X_2$. $\Delta T$ is typically 0.1 seconds. When plotted, the first derivative of the OES data represented by curve 400 shown in FIG. 4 would appear as curve 402. Curve 402 represents the first derivative as a change in the full scale percentage (normalized data values) over a specific time duration ΔT (left-hand scale) versus time. The peak of curve 402 indicates the inflection point of the OES data curve 400.

At step 308, the routine detects the "trigger point" of the OES data curve. The trigger point is user selected during system initialization in step 302. This trigger point selection step forms a trigger criterion generator. The trigger point can be any point on the OES data curve; however, the selection is usually the inflection point in the OES data curve or the etch endpoint of the OES data curve. The etch endpoint is generally defined by the parameters selected to control the endpoint software. Specifically, the value of the first derivative of the OES data at the inflection point repeatably correlates with the etch uniformity across the wafer. Furthermore, if the etching process is stopped before the inflection point is reached, the value of the first derivative at the point where etching is halted (i.e., the endpoint) is indicative of the uniformity across the wafer at that point in time.

The correlation between etch uniformity and the magnitude of the first derivative depends upon the test parameters used as well as the wafer characteristics and wafer recipe. Consequently, the test parameters and wafer characteristics are preloaded at step 301, into the memory of the computer system such that they can be selected by the user at test initiation. Generally, the user will select the present test parameters and wafer characteristics from a menu and a look-up-table associated with those parameters is loaded into memory. The look-up table is a correlation table for values of first derivative and uniformity. The routine, at step 312, accesses the look-up table containing the uniformity versus first derivative correlation values. The table access process that correlates first derivative values and uniformity values forms a data analyzer. Using this look-up table and given a value of the first derivative, the routine generates a uniformity value for the wafer that corresponds to the wafer characteristics and the test parameters of the present test. Alternatively, a correlation equation is used rather than a look-up table. A graphical representation of an illustrative correlation equation is depicted and described in relation to FIG. 5.

At step 314, the routine displays the uniformity value. Alternatively, the uniformity value may be compared to a threshold and, depending upon the uniformity value with respect to the threshold, the routine generates a subjective uniformity term such as uniformity "good" or uniformity "poor". Optionally, at step 316, the routine may compare the uniformity value with a plurality of threshold values where, depending on the particular threshold value that is exceeded by the uniformity value, the routine can make suggestions on how to improve the uniformity. For example, for very poor uniformity, the routine may suggest that the user accomplish a preventive maintenance procedure such as cleaning chamber windows, recalibration of the monochromator and the like.

Figure 5:
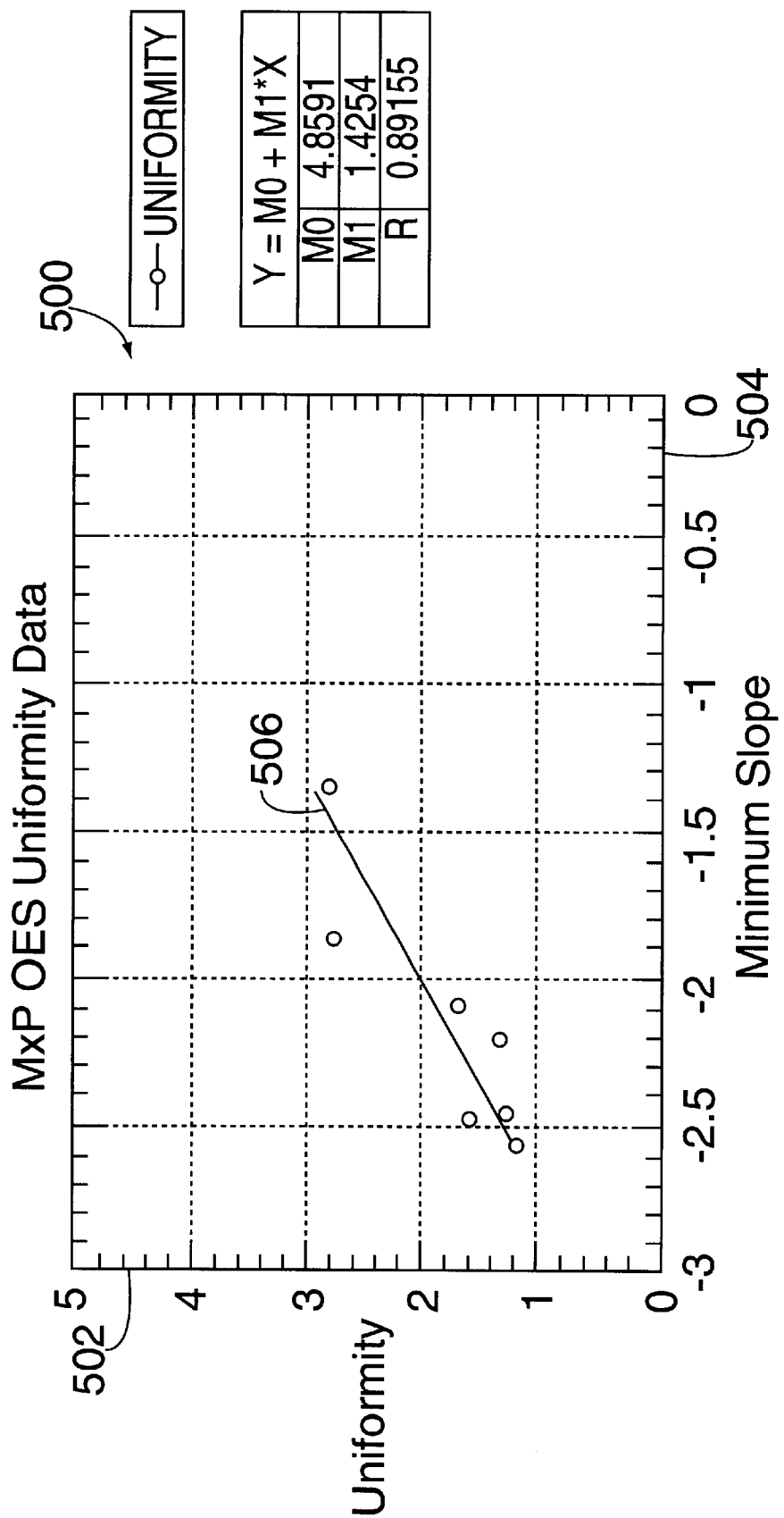
FIG. 5 depicts an illustrative curve that correlates etch uniformity with the first derivative of the OES data curve.

FIG. 5 depicts a graph 500 of etch uniformity (scale 502) versus normalized first derivative values (scale 504) corresponding to a particular test parameter and wafer characteristic set. The first derivative values shown are the "peak" values at the inflection point, also known as the "minimum slope" values. In the illustrative graph, for example, an etch process that attains a minimum slope of −2 would have a coefficient of variation (a measure of uniformity) of 2 percent. Given the particular test parameters and the wafer characteristics, a look-up table containing the information in the graph of FIG. 5 would be used at step 312 of the flow diagram to determine the uniformity given a particular value of first derivatives. Alternatively, a curve fitted to the data points (e.g., curve 506) is used to derive an equation from which any value of uniformity can be derived from a given minimum slope value. The depicted curve is linear (e.g., having the form $Y=M_0+M_1X$), but other forms of linear and non-linear curves can be fitted to the data.

The film thickness measurements used to generate curve 500 were performed using the Prometrix SM-300 and measuring 49 points with a 6 mm edge exclusion before and after etching. The wafers were 150 mm thermal oxide wafers. The test was conducted within a process chamber containing a pressure of 200 mTorr, the cathode temperature was maintained at 20 degree Celsius and 8 Torr of Helium was provided to cool the backside of the wafer. The chamber was provided a 25 sccm flow of $CHF_3$, a 5 sccm flow of $CF_4$, and a 75 sccm flow of Ar. The plasma was powered by 750 Watts and a 30 G magnetic containment field was used. The etch non-uniformity is represented in FIG. 5 using a coefficient of variation, a well-known 1σ uniformity metric. The coefficient of variation (CV) measures variation as a percent of the mean variation and is given by the following ratio:

$$CV = 100 * \left(\frac{\sigma}{\mu}\right)$$

where σ is the observed standard deviation of the wafer surface variations and $\mu$ is the mean of those variations. The non-uniformity discussed herein is presented as a percentage of the mean.

Besides displaying the uniformity (more correctly, the value that is displayed represents non-uniformity), the routine may control the etch process such that the etching of the wafer is concluded when a particular uniformity is reached and after a particular etch rate has been exceeded, thus providing a means of optimally controlling the wafer etch process.

As discussed above, the invention is a method and apparatus for performing direct, in situ measurement of etch uniformity by monitoring, processing and analyzing OES data. The invention computes the first derivative of the OES data. This first derivative value is repeatably indicative of etch uniformity. As such, the invention produces a display of the etch uniformity value and/or in some manner responds to that value.

Although various embodiments which incorporate the teachings of the present invention have been shown and described in detail herein, those skilled in the art can readily devise many other varied embodiments that still incorporate these teachings.

What is claimed is:

1. A method for measuring uniformity of a surface of a wafer as a result of an etching process comprising the steps of:

acquiring data indicating etch progression, wherein said data represents an intensity of an emission at a monitored wavelength of light;

defining a trigger criterion corresponding to a particular value of said data to form a trigger point;

producing, as said data is acquired, a first derivative of said data as a first derivative value, wherein said first derivative value is produced by $$\frac{X_2 - X_1}{\Delta T}$$

where $X_1$ is a data point in said data, and $X_2$ is a data point and $\Delta T$ is a time duration elapsed between acquisition of the and data points, said trigger criterion is a peak of said first derivative; and generating, when said trigger criterion is attained by said data, a uniformity value representing the uniformity of the surface of the wafer by directly correlating said first derivative value to said uniformity value.

2. The method of claim 1 wherein said trigger criterion is a value of said data that represent when an endpoint to an etching process has been attained.

3. The method of claim 1 wherein said trigger criterion is an inflection point in a curve representing said data.

4. The method of claim 1 wherein said generating step comprises the steps of:

addressing a look up table using said first derivative value, where said look up table contains uniformity values correlating to first derivative values; and producing a particular uniformity value in response to said first derivative value at said trigger point.

5. The method of claim 1 wherein said generating step comprises the step of computing a particular uniformity value that corresponds to said first derivative value at said trigger point, where said particular uniformity is computed using a correlation equation that produces uniformity values corresponding to first derivative values.

6. The method of claim 1 further comprising the step of responding to said uniformity value.

* * * * *